US007687861B2

(12) United States Patent
Wu et al.

(10) Patent No.: US 7,687,861 B2
(45) Date of Patent: Mar. 30, 2010

(54) SILICIDED REGIONS FOR NMOS AND PMOS DEVICES

(75) Inventors: Chii-Ming Wu, Taipei (TW);
Chiang-Ming Chuang, Changhua (TW);
Chih-Wei Chang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 243 days.

(21) Appl. No.: 11/248,555

(22) Filed: Oct. 12, 2005

(65) Prior Publication Data

US 2007/0090462 A1    Apr. 26, 2007

(51) Int. Cl.
*H01L 27/092*    (2006.01)
(52) U.S. Cl. ................... 257/369; 257/E21.64
(58) Field of Classification Search ............ 257/E21.64, 257/369; 438/384
See application file for complete search history.

(56) References Cited

U.S. PATENT DOCUMENTS

| | | | | |
|---|---|---|---|---|
| 4,949,136 A | * | 8/1990 | Jain | 257/344 |
| 5,258,645 A | * | 11/1993 | Sato | 257/637 |
| 5,696,012 A | * | 12/1997 | Son | 438/231 |
| 5,882,973 A | * | 3/1999 | Gardner et al. | 438/279 |
| 5,943,565 A | * | 8/1999 | Ju | 438/231 |
| 5,994,743 A | * | 11/1999 | Masuoka | 257/369 |
| 6,127,710 A | * | 10/2000 | Choi et al. | 257/410 |
| 6,506,642 B1 | * | 1/2003 | Luning et al. | 438/231 |
| 6,562,676 B1 | * | 5/2003 | Ju | 438/232 |
| 6,905,923 B1 | * | 6/2005 | Paton et al. | 438/231 |
| 2003/0042514 A1 | * | 3/2003 | Trivedi et al. | 257/274 |
| 2006/0099745 A1 | * | 5/2006 | Hsu et al. | 438/149 |
| 2006/0151776 A1 | * | 7/2006 | Hatada et al. | 257/19 |

OTHER PUBLICATIONS

D. Greenlaw et al., "Taking SOI Substrates and Low-k Dielectrics into High-Volume Microprocessor Production", IEDM Tech. Digest, 2003, pp. 277-280 or 11.1.1-11.1.4.*
Horstmann et al., "Advanced Transistor Structures for High Performance Microprocessors", IEE Int'l Conf. on Int. Cir. Des. and Tech, 2004, p. 65-71.*
Van Zant, Microchip Fabrication: A Practical Guide to Semiconductor Processing, McGraw-Hill, New York, 2004, pp. 264-265 and 354-355.*
Horstmann, M., et al., "Advanced Transistor Structures for High Performance Microprocessors," IEEE International Conference on Integrated Circuit Design and Technology (2004) pp. 65-71.

* cited by examiner

*Primary Examiner*—W. David Coleman
*Assistant Examiner*—Sun M Kim
(74) *Attorney, Agent, or Firm*—Slater & Matsil, L.L.P.

(57) ABSTRACT

A semiconductor device having an NMOS and a PMOS device formed thereon is provided. The NMOS device has additional spacers formed alongside the gate electrode to allow the silicide region to be formed farther away from the gate electrode. By placing the silicide region farther away from the gate electrode, the effects of the lateral encroachment of the silicide region under the spacers is reduced, particularly the leakage. A method of forming the semiconductor device may include forming a plurality of spacers alongside the gate electrodes of a PMOS and an NMOS device, and one or more implants may be performed to implant impurities into the source/drain regions of the PMOS and NMOS devices. One or more of the spacers alongside the gate electrode of the PMOS device may be selectively removed. Thereafter, the source/drain regions may be silicided.

25 Claims, 4 Drawing Sheets

SILICIDED REGIONS FOR NMOS AND PMOS DEVICES

TECHNICAL FIELD

The present invention relates generally to semiconductor devices and, more particularly, to forming NMOS and PMOS devices with silicided source/drain regions.

BACKGROUND

Size reduction of metal-oxide-semiconductor field-effect transistors (MOSFETs), including reduction of the gate length and gate oxide thickness, has enabled the continued improvement in speed, performance, density, and cost per unit function of integrated circuits over the past few decades. Generally, the MOSFETs include a gate electrode formed on a gate dielectric, which is formed on a substrate (usually a silicon semiconductor substrate). Source/drain regions are formed on opposing sides of the gate electrode by implanting N-type or P-type impurities into the substrate. Current flowing through the source/drain regions may then be controlled by controlling the voltage levels applied to the gate electrode.

To increase switching speed and decrease contact resistance, the source/drain regions are often silicided. Typically, the source/drain regions are silicided by forming a metal layer over the source/drain regions and performing an anneal. The annealing causes the metal layer to react with the silicon substrate, thereby forming a silicide layer on the source/drain regions. The silicide layer, however, may cause problems.

One problem is lateral encroachment of the silicide region below the spacers. It has been found, particularly in the case of nickel silicide formed in a substrate doped with N-type impurities, that the silicide region may encroach laterally underneath the spacers, thereby increasing leakage current and decreasing device performance. As device sizes decrease, the lateral encroachment of the silicide region may cause the device to fail or to become unreliable.

Therefore, there is a need for a method and a device that reduce the lateral encroachment of the silicide region.

SUMMARY OF THE INVENTION

These and other problems are generally reduced, solved or circumvented, and technical advantages are generally achieved, by embodiments of the present invention, which provides NMOS and PMOS devices with silicided source/drain regions.

In an embodiment of the present invention, a method of forming a semiconductor device is provided. The method comprises providing a semiconductor substrate having a first region and a second region. A first gate having a first gate electrode formed in the first region, and a second gate having a second gate electrode formed in the second region. A plurality of spacers are formed alongside the first gate and one or more spacers are formed alongside the second gate such that the second gate has fewer spacers than the first gate. One or more implant processes may be performed to implant N-type impurities into the semiconductor substrate in source/drain regions of the first gate, and one or more implant processes may be performed to implant P-type impurities into the semiconductor substrate in source/drain regions of the second gate. Thereafter, at least a portion of the source/drain regions of the first gate and the second gate may be silicided.

In another embodiment of the present invention, a method of forming a semiconductor device is provided. The method comprises providing a substrate having a first region and a second region. A first gate electrode is formed on the first region and a second gate electrode is formed on the second region. A first ion implant is performed in the substrate alongside the first gate electrode, the first ion implant using N-type ions. A second ion implant is performed in the substrate alongside the second gate electrode, the second ion implant using P-type ions. One or more spacers may be formed alongside the first gate electrode and the second gate electrode. One or more implants may be performed in the substrate using N-type ions using the first gate electrode and the one or more spacers adjacent the first gate electrode as a first implant mask, and one or more implants may be performed in the substrate using the second gate electrode and the one or more spacers adjacent the second gate electrode as a second implant mask. A first portion of the substrate adjacent the first gate electrode and a second portion of the substrate may be silicided, the first silicided portion may be positioned farther from the first gate electrode than the second silicided portion from the second gate electrode.

In still another embodiment of the present invention, a method of forming a semiconductor device is provided. The method comprises providing a semiconductor substrate having a first region and a second region. A first gate and a second gate are formed. A first gate electrode is formed on the first gate in the first region and a second gate electrode is formed on the second gate in the second region. A plurality of spacers may be formed adjacent the first gate and the second gate, respectively. One or more implants processes may be performed to implant N-type impurities into the semiconductor substrate in the first region and P-type impurities into the semiconductor substrate in the second region. A first and second source/drain may be formed. One or more of the spacers adjacent the second gate may be removed. At least a portion of the source/drain regions of the first and second gate may be silicided.

In yet another embodiment of the present invention, a semiconductor device formed on a substrate is provided. The semiconductor device comprises an NMOS transistor having a first gate electrode and a first source/drain region formed in the substrate on opposing sides of the first gate electrode, the NMOS transistor having a plurality of spacers formed alongside of the first gate electrode, the first source/drain region having a first silicided region; and a PMOS transistor having a second gate electrode and a second source/drain region formed in the substrate on opposing sides of the second gate electrode, the PMOS transistor having fewer spacers formed alongside the second gate electrode than the NMOS transistor, the second source/drain region having a second silicided region.

In still yet another embodiment of the present invention, a semiconductor device formed on a substrate is provided. The semiconductor device comprises an NMOS transistor having a first gate electrode and first source/drain regions formed in the substrate adjacent the first gate electrode, wherein N is an integer, and a PMOS transistor having a second gate electrode and second source/drain regions formed in the substrate adjacent the second gate electrode, the PMOS transistor having M spacers formed adjacent the second gate electrode, wherein M is an integer less than N.

It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The object and other advantages of this invention are best described in the preferred embodiment with reference to the attached drawings that include.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

FIGS. 1-7 illustrate a method embodiment for fabricating a semiconductor device having PMOS devices with silicided source/drain regions having different profiles than the silicided source/drain regions of NMOS devices in accordance with an embodiment of the present invention. Embodiments of the present invention illustrated herein may be used in a variety of circuits. In particular, embodiments of the present invention are particularly useful in sub-0.2 µm designs in which silicide encroachment under the spacer may be particularly troublesome.

Figure 1:
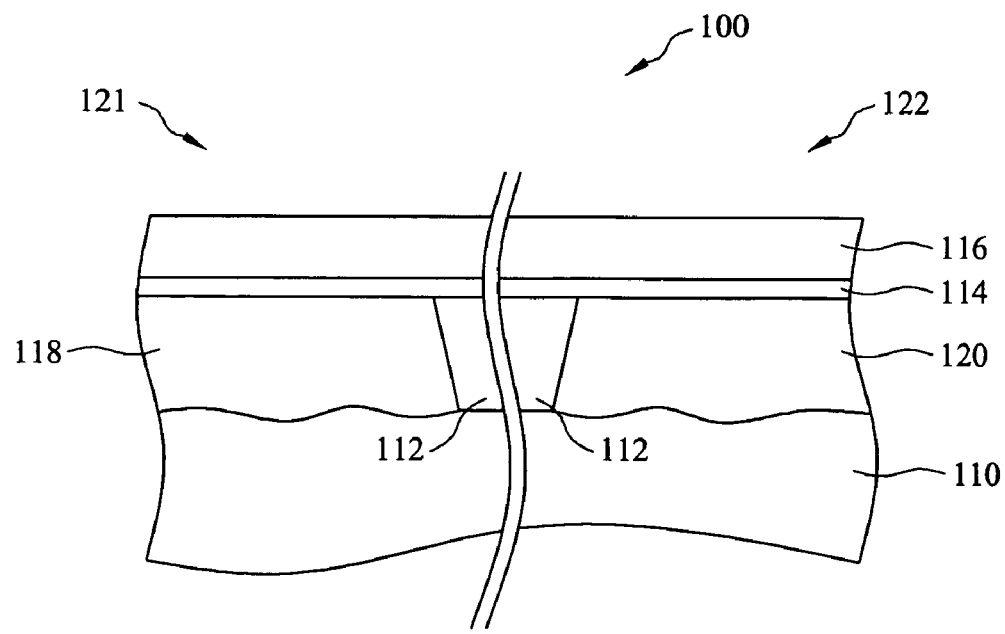
FIGS. 1-7 illustrate cross-sections of a wafer after various process steps have been performed to fabricate an NMOS and a PMOS device in accordance with an embodiment of the present invention.

Referring first to FIG. 1, a wafer 100 is shown comprising a substrate 110 having shallow trench isolations (STIs) 112, a dielectric layer 114, and a conductive layer 116 formed thereon. In the preferred embodiment, the substrate 110 comprises a bulk silicon substrate having an optional P-well 118 and N-well 120 formed therein, wherein the P-well 118 is formed in an NMOS region 121 in which NMOS devices may be formed and wherein the N-well 120 is formed in a PMOS region 122 in which PMOS devices may be formed. Other materials, such as germanium, silicon-germanium alloy, or the like, could alternatively be used for the substrate 110. Alternatively, the silicon substrate 110 may be an active layer of a semiconductor-on-insulator (SOI) substrate or a multi-layered structure such as a silicon-germanium layer formed on a bulk silicon layer.

The dielectric layer 114 comprises a dielectric material, such as silicon dioxide, silicon oxynitride, silicon nitride, a nitrogen-containing oxide, a high-K metal oxide, a combination thereof, or the like. A silicon dioxide dielectric layer may be formed, for example, by an oxidation process, such as wet or dry thermal oxidation. In the preferred embodiment, the dielectric layer 114 is about 10 Å to about 50 Å in thickness.

The conductive layer 116 comprises a conductive material, such as a metal (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), doped poly-crystalline silicon, other conductive materials, or a combination thereof. In one example, amorphous silicon is deposited and re-crystallized to create poly-crystalline silicon (poly-silicon). The polysilicon layer may be formed by depositing doped or undoped poly-silicon by low-pressure chemical vapor deposition (LPCVD) to a thickness in the range of about 200 Å to about 2000 Å, but more preferably about 1000 Å.

Furthermore, the STIs 112 may be formed in the substrate 110 to isolate active areas on the substrate. The STIs 112 may be formed by etching trenches in the substrate and filling the trenches with a dielectric material, such as silicon dioxide, a high-density plasma (HDP) oxide, or the like.

Figure 2:
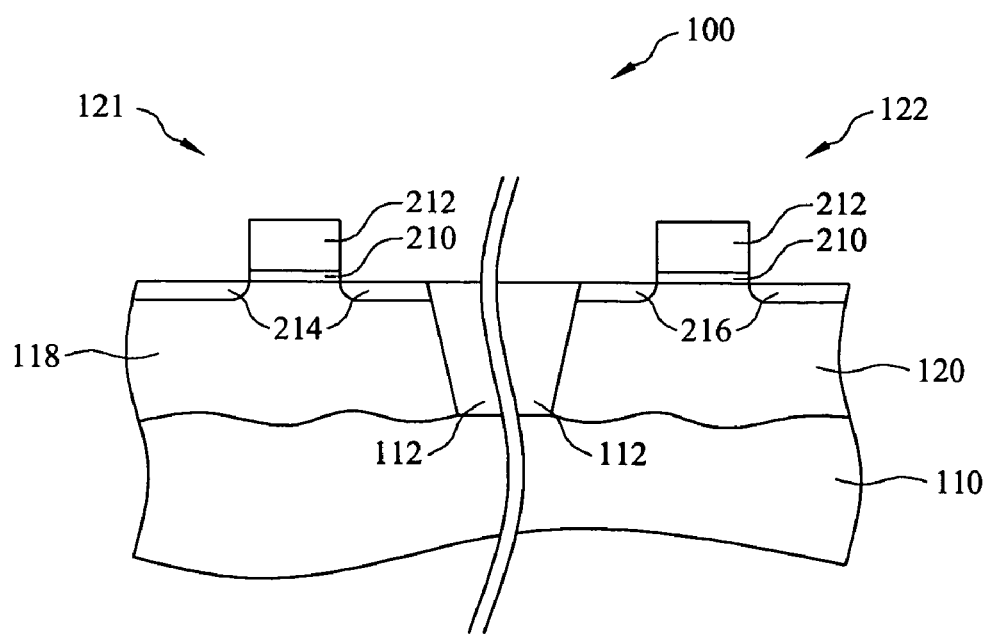

FIG. 2 illustrates the wafer 100 of FIG. 1 after a gate dielectric 210 and a gate electrode 212 have been patterned and after a first N-type implant region 214 and a first P-type implant region 216 have been formed in accordance with an embodiment of the present invention. The gate dielectric 210 and gate electrode 212 may be formed from the dielectric layer 114 and the conductive layer 116, respectively, using photolithography techniques known in the art. Generally, photolithography involves depositing a photoresist material, which is then masked, exposed, and developed. After the photoresist material is patterned, an etching process may be performed to remove unwanted portions of the dielectric layer 114 and the conductive layer 116 (see FIG. 1) to form the gate dielectric 210 and gate electrode 212 as illustrated in FIG. 2. In an embodiment in which the gate electrode 212 is formed of poly-silicon and the gate dielectric 210 is formed of silicon oxide, the etching process may be a wet or dry, anisotropic or isotropic, etch process, but preferably is an anisotropic dry etch process.

The first N-type implant region 214 forms lightly-doped drain (LDD) regions for an NMOS transistor in the NMOS region 121. In a preferred embodiment, a first mask (not shown) is formed and patterned over the PMOS region 122 such that the N-type dopants will not be implanted in the PMOS region 122. The first N-type implant region 214 may be doped with, for example, an N-type dopant, such as arsenic ions at a dose of about 2e13 to about 5e15 atoms/cm$^2$ and at an energy of about 3 to about 15 KeV. Alternatively, the first N-type implant region 214 may be doped with other N-type dopants such as phosphorous, nitrogen, antimony, or the like. The first mask may be removed after forming the first N-type implant region 214.

The first P-type implant region 216 forms the LDD regions for a PMOS transistor in the PMOS region 122. In a preferred embodiment, a second mask (not shown) is formed and patterned over the NMOS region 121 such that the P-type dopants will not be implanted in the NMOS region 121. The first P-type implant region 216 may be doped with, for example, a P-type dopant, such as boron ions at a dose of about 2e13 to about 5e15 atoms/cm$^2$ and at an energy of about 0.3 to about 2 KeV. Alternatively, the first P-type implant region 216 may be doped with other P-type dopants such as $BF_2$, $F_2$, aluminum, gallium, indium, or the like. The second mask may be removed after forming the first P-type implant region 216.

Figure 3:
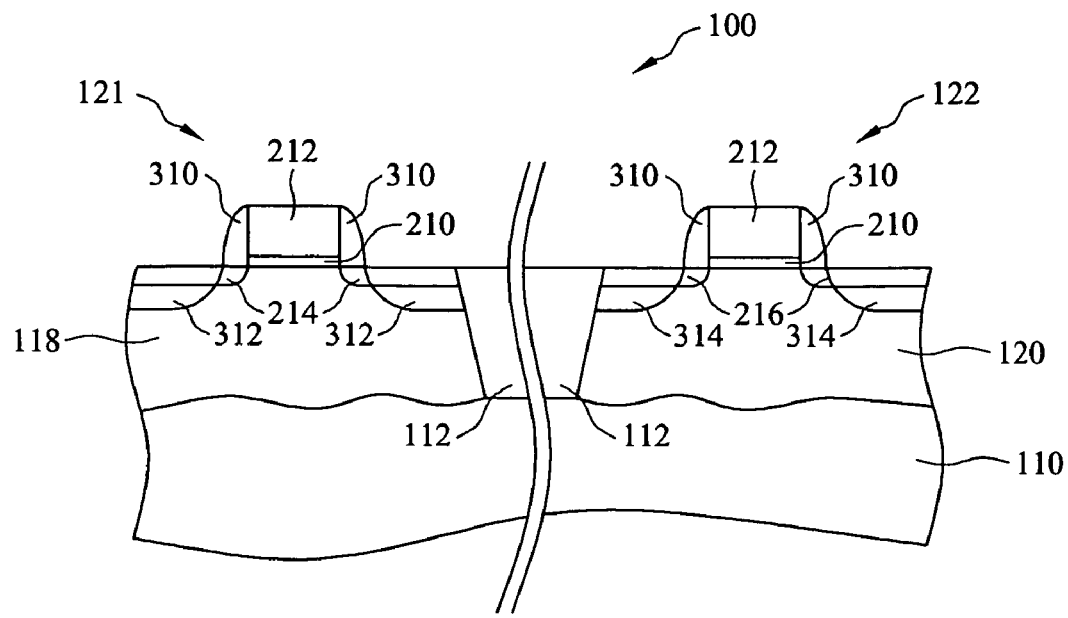

FIG. 3 illustrates the wafer 100 of FIG. 2 after first implant spacers 310 have been formed and optional second N-type implant regions 312 and/or optional second P-type implant regions 314 have been formed. The first implant spacers 310, which form spacers for a second ion implant in the source/drain regions, preferably comprise a nitrogen-containing layer, such as silicon nitride ($Si_3N_4$), silicon oxynitride $SiO_xN_y$, silicon oxime $SiO_xN_y:H_z$, or a combination thereof. In a preferred embodiment, the first implant spacers 310 are formed from a layer comprising $Si_3N_4$ that has been formed using chemical vapor deposition (CVD) techniques using silane and ammonia ($NH_3$) as precursor gases. Other materials and processes may be used. In other embodiments, an additional thin oxide layer may optionally be added between the first implant spacers 310 and the gate electrode 212 as a buffer layer to release stress.

The first implant spacer 310 maybe patterned by performing an isotropic or anisotropic etch process, such as an isotropic etch process using a solution of phosphoric acid ($H_3PO_4$). Because the thickness of the layer of $Si_3N_4$ (or other material) is greater in the regions adjacent to the gate electrode 212, the isotropic etch removes the $Si_3N_4$ material on top of the gate electrode 212 and the areas of the substrate 110 not immediately adjacent to the gate electrode 212, thereby forming the first implant spacers 310 as illustrated in FIG. 3.

The optional second N-type implant regions 312 and/or optional second P-type implant regions 314 may be formed if the additional dopant is desired to obtain the desired junction characteristics for a particular application. It should be noted that in some embodiments, it may be desirable to form only one of the second N-type implant regions 312 and the second P-type implant regions 314. The optional second N-type implant regions 312 and/or optional second P-type implant regions 314 may be formed in a similar manner as the first N-type implant region 214 and the first P-type implant regions 216, respectively, discussed above. In an embodiment, the second N-type implant regions 312 may be doped with an N-type dopant, such as arsenic (or some other N-type dopant) ions, at a dose of about 2e13 to about 5e15 atoms/cm$^2$ and at an energy of about 4 to about 30 KeV using the first implant spacers 310 and the gate electrode 212 as an implant mask, and the second P-type implant regions 314 may be doped with a P-type dopant, such as boron (or some other P-type dopant) ions, at a dose of about 2e13 to about 5e15 atoms/cm$^2$ and at an energy of about 0.8 to about 15 KeV using the first implant spacers 310 and the gate electrode 212 as an implant mask. Generally, it is preferred that the second P-type implant regions 314 and the second N-type implant regions 312 be formed using a higher energy level than that used to form the first P-type implant regions 216 and the first N-type implant regions 214.

It should be noted that masks may be used to protect the PMOS region 122 while implanting N-type dopants in the NMOS region 121 and to protect the NMOS region 121 while implanting P-type dopants in the PMOS region 122.

Figure 4:
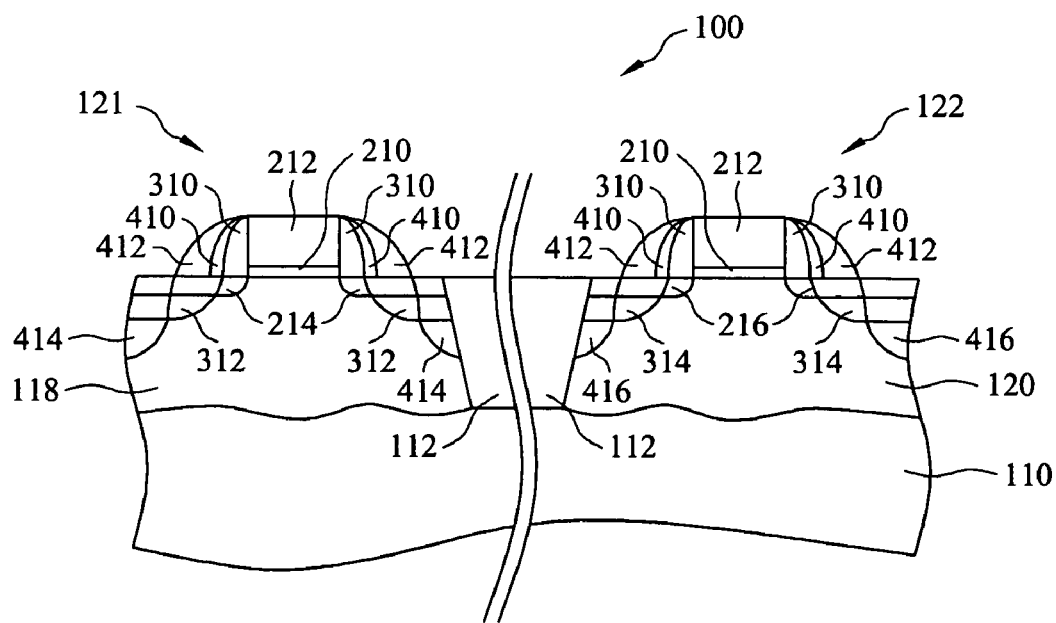

FIG. 4 illustrates the wafer 100 of FIG. 3 after a liner 410 and second implant spacers 412 have been formed. The liner 410, which acts as an etch stop during the etching process to form the second implant spacers 412, is preferably formed of a material having different etch characteristics than the material used to form the first implant spacers 310 and the second implant spacers 412. For example, in an embodiment in which the first implant spacers 310 are formed of silicon nitride, the liner 410 may be formed of an oxide.

The oxide liner may be formed, for example, by performing a blanket deposition process by chemical vapor deposition (CVD) techniques using tetra-ethyl-ortho-silicate (TEOS) and oxygen as a precursor to a thickness of about 20 Å to about 100 Å in thickness, but more preferably about 40-60 Å in thickness. An etching process may then be performed to form the liners 410 as illustrated in FIG. 4. One etching process that may be used to etch an oxide liner comprises an anisotropic plasma etch process using an ambient environment of $CF_4$, $C_2F_6$, a mixture of $C_xF_y$ and $O_2$, or the like. Other etching processes may be used.

The second implant spacers 412 preferably comprise a nitrogen-containing layer, such as silicon nitride ($Si_3N_4$), silicon oxynitride $SiO_xN_y$, silicon oxime $SiO_xN_y$:$H_z$, or a combination thereof. In a preferred embodiment, the second implant spacers 412 are formed from a layer comprising $Si_3N_4$ that has been formed using chemical vapor deposition (CVD) techniques using silane and ammonia ($NH_3$) as precursor gases and deposition temperatures ranging from about 400° to about 650° C. to a thickness of about 150 Å to about 500 Å, but more preferably about 300 Å. Other materials, processes, and thicknesses may be used.

Thereafter, third N-type implant regions 414 and third P-type implant regions 416, which form the source/drain regions, may be formed if desired to obtain the desired junction characteristics for a particular application. The third N-type implant regions 414 and third P-type implant regions 416 may be formed in a similar manner as the first N-type implant regions 214 and the first P-type implant regions 216, respectively, discussed above. In an embodiment, the third N-type implant regions 414 may be doped with an N-type dopant, such as arsenic (or some other N-type dopant) ions, at a dose of about 2e13 to about 5e15 atoms/cm$^2$ and at an energy of about 4 to about 30 KeV using the first implant spacers 310, the second implant spacers 412, and the gate electrode 212 as an implant mask. The third P-type implant regions 416 may be doped with a P-type dopant, such as boron (or some other P-type dopant) ions, at a dose of about 2e13 to about 5e15 atoms/cm$^2$ and at an energy of about 0.8 to about 15 KeV using the first implant spacers 310, the second implant spacers 412, and the gate electrode 212 as an implant mask.

Figure 5:
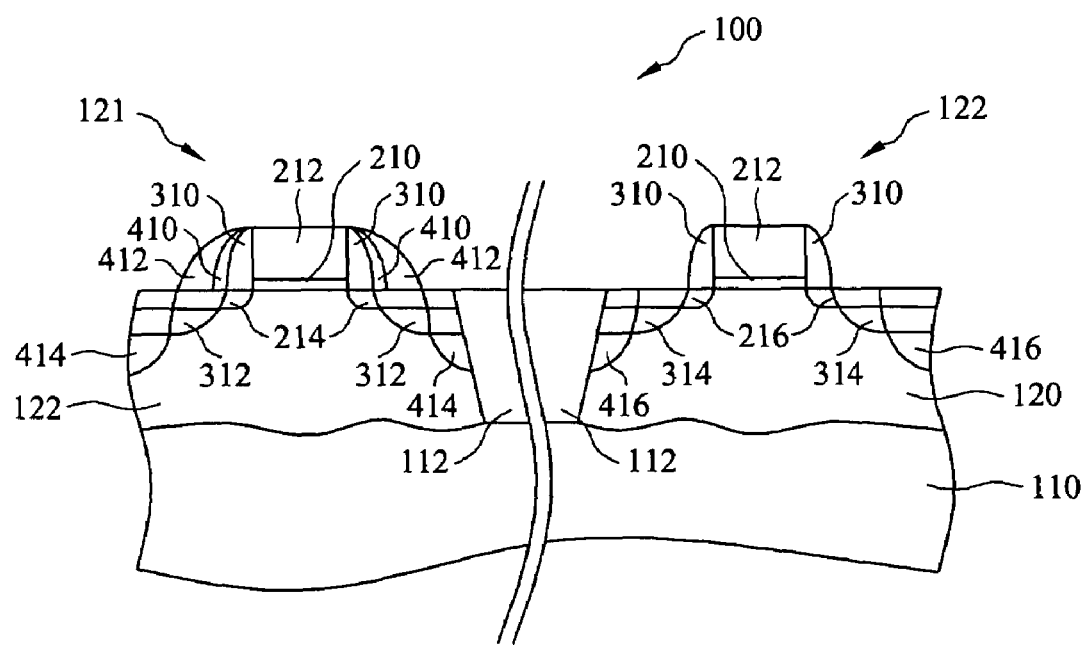

FIG. 5 illustrates the wafer 100 after the second implant spacers 412 and, optionally, the liners 410 have been selectively removed from the PMOS region 122. As will be discussed below, it is preferable to remove the second implant spacers 412 and, optionally, the liners 410 from the PMOS region 122 prior to performing a silicidation process. In an embodiment of the present invention in which the second implant spacers 412 are formed of silicon nitride, the second implant spacers 412 may be removed by masking the NMOS region 121 and performing a dry etch with $Ch_xF_y$. Other etching processes may be used.

Optionally, the liners 410 may be removed. Removal of the liners 410 may allow the silicide regions to be placed closer to the gate electrode 212. Furthermore, the removal of the liners 410 may allow further optimization with a stress-inducing film, such as a compressive film. Placing the compressive film closer to the channel may help optimize the stress within the channel. The liners 410 may be removed by, for example, a wet dip in a solution of dilute hydrofluoric acid. Other processes may be used.

Figure 6:
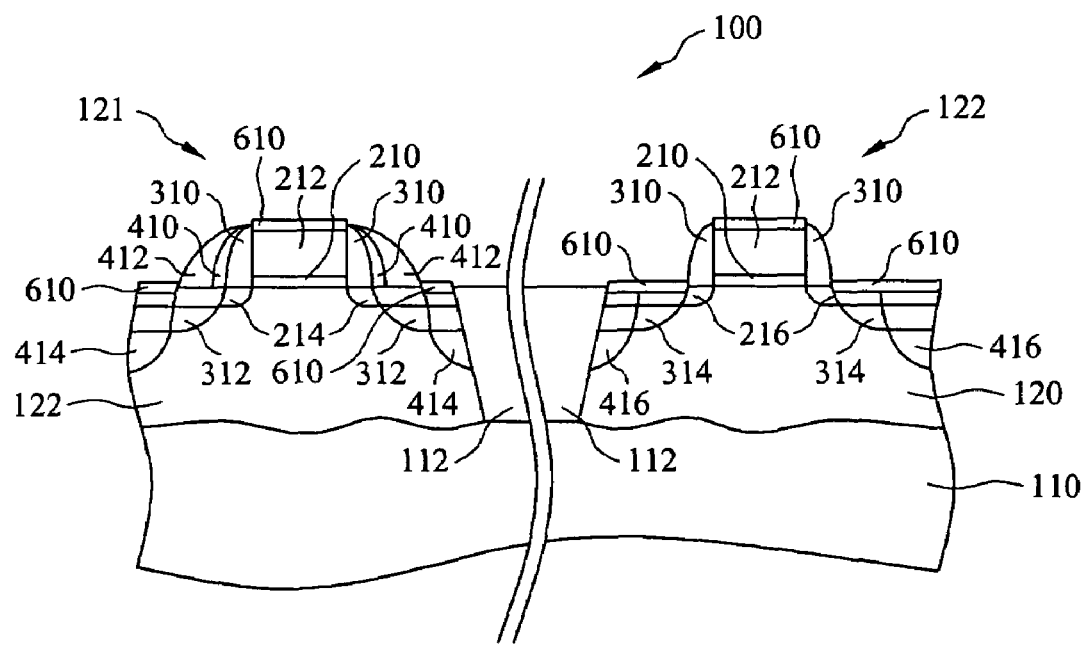

FIG. 6 illustrates the wafer 100 of FIG. 5 after silicide regions 610 have been formed in accordance with an embodiment of the present invention. The silicidation process may be used to decrease the contact resistance between contact plugs (not shown) and source/drain regions and the gate electrodes 212. The silicide regions 610 may be formed by depositing a metal layer such as a nickel-based layer via plasma vapor deposition (PVD) procedures. An anneal procedure causes the metal layer to react with the gate electrode 212 and the source/drain regions to form a metal silicide, e.g., nickel silicide. Portions of the metal layer overlying first implant spacers 310 and the second implant spacers 412 remain unreacted. Selective removal of the unreacted portions of the metal layer may be accomplished, for example, by wet etch procedures. An additional anneal cycle may be used if desired to alter the phase of silicide regions, which may result in a lower resistance.

Figure 7:
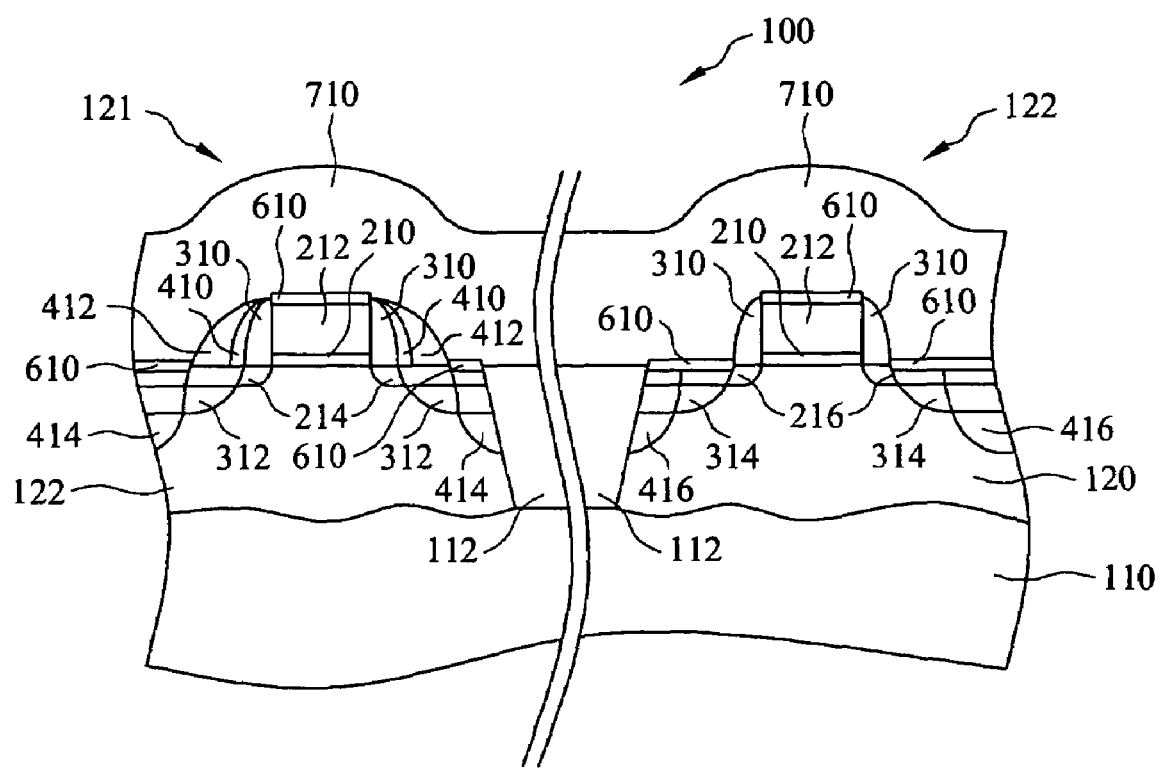

FIG. 7 illustrates wafer 100 of FIG. 6 after an optional etch stop layer 710 has been formed in the NMOS region 121 and the PMOS region 122 in accordance with an embodiment of the present invention. The etch stop layer 710 acts as a stop layer for subsequent processing steps, such as an etching process to form a contact hole through an inter-layer dielectric (ILD) (not shown) without over-etching. The etch stop layer 710 preferably comprises a dielectric material, such as silicon nitride, silicon oxynitride, or the like. The etch stop layer 710 may also be a composite layer formed of, for example, silicon nitride/silicon dioxide, silicon oxynitride/silicon dioxide, silicon oxynitride/silicon nitride, or the like. In an embodiment, the etch stop layer 710 may be formed of silicon nitride deposited by chemical vapor deposition (CVD) in an ambient of silicon-containing and nitrogen-containing gases. The etch stop layer 710 is preferably about 200 Å to about 1000 Å in thickness, but most preferably about 250 Å to about 6800 Å in thickness.

It should be noted, however, that the etch stop layer 710 may exert stress in the channel region. In this case, the material used for the etch stop layer 710 is preferably selected such that the total stress exerted in the channel region of the NMOS region 121 is a tensile stress to increase electron mobility and that the total stress exerted in the channel region of the PMOS region 122 is a compressive stress to increase hole mobility.

In an alternative embodiment, a tensile-stress film may be formed in the NMOS region 121 and a compressive-stress film may be formed in the PMOS region 122. For example, a tensile-stress film may be formed over the NMOS region 121 and the PMOS region 122. The tensile-stress film may then be removed from the PMOS region 122, and a compressive-stress film may be formed over the wafer. In this manner, a single compressive-stress film is formed over the PMOS region 122 to increase hole mobility, and a composite film of a compressive-stress film formed over a tensile-stress film (preferably having a total tensile stress) is formed over the NMOS region 121 to increase electron mobility. Other structures may also be used, such as a composite film formed over the PMOS region 122 (preferably having a total compressive stress) and a single film over the NMOS region 121, single films selectively formed over each of the PMOS region 122 and NMOS region 121, and the like.

It should be noted that, in an optional embodiment, the etch-stop layer 710 may be selectively removed from the gate electrode 212, as it has been found that a high-stress film positioned over the gate electrode may result in a tensile stress or compressive stress, respectively, in the downward direction in the channel region, adversely affecting the performance of the transistor.

As discussed above, the second implants are optional implants and may be performed to customize the junction characteristics of a specific transistor. Additionally, it should be noted that embodiments of the present invention may utilize a different number of implants for the PMOS transistor than the NMOS transistor. For example, one type of transistor may be formed using only two implants while the other type of transistor may be formed using three implants. Other combinations of implants and implant masks may be used to further customize a particular NMOS and/or PMOS transistor to a specific application.

One skilled in the art will appreciate that embodiments of the present invention may be used to independently control the lateral encroachment of silicided source/drain regions of NMOS devices. In particular, embodiments of the present invention may be used to control the NiSi encroachment that may occur at the high arsenic concentration area. The additional spacers used for the NMOS devices allow the distance between the NiSi in the source/drain regions and the gate dielectric to be increased, and the implants near the gate dielectric may be lighter. In this manner, the NiSi encroachment drilling into the gate dielectric may be reduced and/or limited.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device formed on a substrate, the semiconductor device comprising:

an NMOS transistor having a first gate electrode and first source/drain regions formed in the substrate on opposing sides of the first gate electrode, the NMOS transistor having a plurality of spacers formed alongside the first gate electrode, the first source/drain regions having a first silicided region; and a PMOS transistor having a second gate electrode and second source/drain regions formed in the substrate on opposing sides of the second gate electrode, the PMOS transistor having fewer spacers formed alongside the second gate electrode than the NMOS transistor, the second source/drain regions having a second silicided region, wherein every diffusion region of the first source/drain regions is a substantially equal distance from the first gate electrode as a corresponding diffusion region of the second source/drain regions is from the second gate electrode, wherein the substrate, the first source/drain regions, and the second source/drain regions have the same composition.

2. The semiconductor device of claim 1, wherein the first silicided region and the second silicided region comprise nickel silicide.

3. The semiconductor device of claim 1, further comprising a compressive strain film formed over the PMOS transistor.

4. The semiconductor device of claim 1, further comprising a tensile strain film formed over the NMOS transistor.

5. The semiconductor device of claim 1, further comprising an etch stop layer over the NMOS transistor and the PMOS transistor, wherein a compressive stress is induced in a channel region of the PMOS transistor and a tensile stress is induced in a channel region of the NMOS transistor.

6. The semiconductor device of claim 1, further comprising a liner formed between two or more of the plurality of spacers formed alongside the first gate electrode.

7. The semiconductor device of claim 1, wherein the plurality of spacers formed alongside the first gate electrode and the spacers formed alongside the second gate electrode are formed of a nitrogen-containing material.

8. A semiconductor device formed on a substrate, the semiconductor device comprising:

an NMOS transistor having a first gate electrode and first source/drain regions formed in the substrate adjacent the first gate electrode, the NMOS transistor having N spacers formed adjacent the first gate electrode, wherein N is an integer, the substrate in a channel region of the NMOS transistor and the first source/drain regions having a first uniform composition; and a PMOS transistor having a second gate electrode and second source/drain regions formed in the substrate adjacent the second gate electrode, the PMOS transistor having M spacers formed adjacent the second gate electrode, wherein M is an integer less than N, wherein the first source/drain regions and the second source/drain regions have similar doping profiles, the substrate in a channel region of the PMOS transistor and the second source/drain regions having a second uniform composition.

9. The semiconductor device of claim 8, wherein the first source/drain regions include a first silicided region.

10. The semiconductor device of claim 9, wherein the first silicided region comprises nickel silicide.

11. The semiconductor device of claim 8, wherein the second source/drain regions include a second silicided region.

12. The semiconductor device of claim 11, wherein the second silicided region comprises nickel silicide.

13. The semiconductor device of claim 8, further comprising a compressive strain film formed over the PMOS transistor.

14. The semiconductor device of claim 8, further comprising a tensile strain film formed over the NMOS transistor.

15. The semiconductor device of claim 8, further comprising an etch stop layer over the NMOS transistor and the PMOS transistor, wherein a compressive stress is induced in the channel region of the PMOS transistor and a tensile stress is induced in the channel region of the NMOS transistor.

16. The semiconductor device of claim 8, further comprising a liner formed between the N spacers formed adjacent the first gate electrode.

17. The semiconductor device of claim 8, wherein the N spacers formed adjacent the first gate electrode and the M spacers formed adjacent the second gate electrode are formed of a nitrogen-containing material.

18. A semiconductor device formed on a substrate, the semiconductor device comprising:
an NMOS transistor having a first gate electrode and first source/drain regions formed in the substrate on opposing sides of the first gate electrode, the first source/drain regions having a first implant region adjacent the first gate electrode, a second implant region on an opposing side of the first implant region from the first gate electrode, and a third implant region on an opposing side of the second implant region from the first implant region, the third implant region having a greater ion concentration than the second implant region, the second implant region having a greater ion concentration than the first implant region, the first source/drain regions having a first silicided region; and
a PMOS transistor having a second gate electrode and second source/drain regions formed in the substrate on opposing sides of the second gate electrode, the second source/drain regions having a fourth implant region adjacent the second gate electrode, a fifth implant region on an opposing side of the fourth implant region from the second gate electrode, and a sixth implant region on an opposing side of the fifth implant region from the fourth implant region, the sixth implant region having a greater ion concentration than the fifth implant region, the fifth implant region having a greater ion concentration than the fourth implant region, the second source/drain regions having a second silicided region, the first silicided region being positioned farther from the first gate electrode than the second silicided region is positioned from the second gate electrode, wherein a first distance from the sixth implant region to the second gate electrode is substantially equivalent to a second distance from the third implant region to the first gate electrode, the PMOS transistor and the NMOS transistor not including a recess in the substrate filled with a stress material.

19. The semiconductor device of claim 18, wherein the first silicided region and the second silicided region comprise nickel silicide.

20. The semiconductor device of claim 18, further comprising a compressive strain film formed over the PMOS transistor.

21. The semiconductor device of claim 18, further comprising a tensile strain film formed over the NMOS transistor.

22. The semiconductor device of claim 18, further comprising an etch stop layer over the NMOS transistor and the PMOS transistor, wherein a compressive stress is induced in a channel region of the PMOS transistor and a tensile stress is induced in a channel region of the NMOS transistor.

23. The semiconductor device of claim 18, further comprising one or more spacers formed adjacent the first gate electrode and the second gate electrode, respectively, the second gate electrode having fewer spacers than the first gate electrode.

24. The semiconductor device of claim 23, further comprising a liner formed between two or more of the spacers formed alongside the first gate electrode.

25. The semiconductor device of claim 23, wherein the spacers formed alongside the first gate electrode and the second gate electrode are formed of a nitrogen-containing material.

* * * * *